United States Patent [19]

Fujiwara et al.

[11] Patent Number: 5,563,894
[45] Date of Patent: Oct. 8, 1996

[54] ERROR DETECTING AND CORRECTING METHOD AND SYSTEM

[75] Inventors: Eiji Fujiwara, Tokyo; Hiroshi Kosuge; Yoshio Kiriu, both of Hadano, all of Japan

[73] Assignee: Hitachi, Ltd., Tokyo, Japan

[21] Appl. No.: 986,478

[22] Filed: Dec. 7, 1992

[30] Foreign Application Priority Data

Dec. 10, 1991 [JP] Japan .................................. 3-325526

[51] Int. Cl.⁶ .................................................. H03M 13/00
[52] U.S. Cl. ........................................ 371/37.1; 371/37.2
[58] Field of Search ........................... 371/37.1, 37.2, 371/37.3, 37.4, 38.1, 40.1, 37.7, 40.2

[56] References Cited

U.S. PATENT DOCUMENTS

| | | | |
|---|---|---|---|
| 4,413,339 | 11/1983 | Riggle et al. | 371/40.1 |
| 4,849,975 | 7/1989 | Patel | 371/38 |
| 4,888,774 | 12/1989 | Kosuge et al. | 371/38.1 |
| 4,949,342 | 8/1990 | Shimbo et al. | 371/40.1 |
| 5,020,060 | 5/1991 | Murai et al. | 371/37.1 |

OTHER PUBLICATIONS

T. Rao et al.; "Error–Control Coding for Computer Systems"; 1989; pp. 230–245.

E. Fujiwara et al, "Single b–Bit Error Correcting and Double Bit Error Detecting Codes for High Speed Memory Systems"; 1992, pp. 894–500.

Fujiwara, Eiji and Taku Gohya, "A Design Method for Single Byte Error Correcting–Double Bit Error Detecting Codes," Transactions of the IEICE of Japan, vol. 91, No. 78, pp. 17–22. (Japanese).

Fujiwara, Eiji and Taku Gohya, "Single Byte Error Correcting–Double Bit Error Detecting (SbEC–DED) Codes," Proc. 1991, IEEE Int. Symp. on Inform. Theory, Jun. 1991, p. 140. (English).

Primary Examiner—Roy N. Envall, Jr.
Assistant Examiner—Brian C. Oakes
Attorney, Agent, or Firm—Fay, Sharpe, Beall, Fagan, Minnich & McKee

[57] ABSTRACT

An error detecting and correcting apparatus includes a unit for receiving an encoded word including a plurality of b-bit bytes (b is an integer not less than two) and generating syndrome from the encoded word according to a first parity check matrix $H_1$, and a unit for correcting errors in the received encoded word based on the syndrome.

16 Claims, 16 Drawing Sheets

FIG. 1

$$I = T^0 = \begin{bmatrix} 1 & 0 & 0 & 0 \\ 0 & 1 & 0 & 0 \\ 0 & 0 & 1 & 0 \\ 0 & 0 & 0 & 1 \end{bmatrix} \quad T = \begin{bmatrix} 0 & 0 & 0 & 1 \\ 1 & 0 & 0 & 1 \\ 0 & 1 & 0 & 0 \\ 0 & 0 & 1 & 0 \end{bmatrix} \quad T^2 = \begin{bmatrix} 0 & 0 & 1 & 0 \\ 0 & 0 & 1 & 1 \\ 1 & 0 & 0 & 1 \\ 0 & 1 & 0 & 0 \end{bmatrix} \quad T^3 = \begin{bmatrix} 0 & 1 & 0 & 0 \\ 0 & 1 & 1 & 0 \\ 0 & 0 & 1 & 1 \\ 1 & 0 & 0 & 1 \end{bmatrix}$$

$$T^4 = \begin{bmatrix} 1 & 0 & 0 & 1 \\ 1 & 1 & 0 & 1 \\ 0 & 1 & 1 & 0 \\ 0 & 0 & 1 & 1 \end{bmatrix} \quad T^5 = \begin{bmatrix} 0 & 0 & 1 & 1 \\ 1 & 0 & 1 & 0 \\ 1 & 1 & 0 & 1 \\ 0 & 1 & 1 & 0 \end{bmatrix} \quad T^6 = \begin{bmatrix} 0 & 1 & 1 & 0 \\ 0 & 1 & 0 & 1 \\ 1 & 0 & 1 & 0 \\ 1 & 1 & 0 & 1 \end{bmatrix} \quad T^7 = \begin{bmatrix} 1 & 1 & 0 & 1 \\ 1 & 0 & 1 & 1 \\ 0 & 1 & 0 & 1 \\ 1 & 0 & 1 & 0 \end{bmatrix}$$

$$T^8 = \begin{bmatrix} 1 & 0 & 1 & 0 \\ 0 & 1 & 1 & 1 \\ 1 & 0 & 1 & 1 \\ 0 & 1 & 0 & 1 \end{bmatrix} \quad T^9 = \begin{bmatrix} 0 & 1 & 0 & 1 \\ 1 & 1 & 1 & 1 \\ 0 & 1 & 1 & 1 \\ 1 & 0 & 1 & 1 \end{bmatrix} \quad T^{10} = \begin{bmatrix} 1 & 0 & 1 & 1 \\ 1 & 1 & 1 & 0 \\ 1 & 1 & 1 & 1 \\ 0 & 1 & 1 & 1 \end{bmatrix} \quad T^{11} = \begin{bmatrix} 0 & 1 & 1 & 1 \\ 1 & 1 & 0 & 0 \\ 1 & 1 & 1 & 0 \\ 1 & 1 & 1 & 1 \end{bmatrix}$$

$$T^{12} = \begin{bmatrix} 1 & 1 & 1 & 1 \\ 1 & 0 & 0 & 0 \\ 1 & 1 & 0 & 0 \\ 1 & 1 & 1 & 0 \end{bmatrix} \quad T^{13} = \begin{bmatrix} 1 & 1 & 1 & 0 \\ 0 & 0 & 0 & 1 \\ 1 & 0 & 0 & 0 \\ 1 & 1 & 0 & 0 \end{bmatrix} \quad T^{14} = \begin{bmatrix} 1 & 1 & 0 & 0 \\ 0 & 0 & 1 & 0 \\ 0 & 0 & 0 & 1 \\ 1 & 0 & 0 & 0 \end{bmatrix}$$

FIG. 2

$$H_1 = \begin{bmatrix} 1 & 1 & 1 & 1 & 1 & 1 & 1 & 1 & 1 & 1 & 1 & 1 & 1 & 1 & 1 & 1 & 0 & 0 & 0 & 0 \\ T & T & T & T & T^2 & T^2 & T^2 & T^2 & T^4 & T^4 & T^4 & T^4 & T^8 & T^8 & T^8 & T^8 & I & I & I & I \\ T & T^2 & T^4 & T^8 & T & T^2 & T^4 & T^8 & T & T^2 & T^4 & T^8 & T & T^2 & T^4 & T^8 & T & T^2 & T^4 & T^8 \end{bmatrix}$$

FIG. 3

$$H_2 = \begin{bmatrix} I & I & I & I & I & I & I & I & I & I & I & I \\ 0 & T^5 & I & T^{10} & T^9 & T^6 & T^7 & T^{13} & T^4 & T^8 & T & T^2 \\ 0 & T^5 & I & T^{10} & T^6 & T^9 & T^{13} & T^7 & T & T^2 & T^4 & T^8 \end{bmatrix}$$

$$\begin{matrix} I & I & I & I & 0 & 0 & 0 & 0 \\ T^{14} & T^{12} & T^3 & T^{11} & I & T^{10} & 0 & T^5 \\ T^{11} & T^3 & T^{12} & T^{14} & 0 & T^5 & I & T^{10} \end{matrix}$$

FIG. 4

$$H_3 = \begin{bmatrix} I & I & I & I & I & I & I & I & I & I & I & I \\ T & T^2 & T^4 & T^8 & T^3 & T^{11} & T^{12} & T^{14} & T^6 & T^7 & T^9 & T^{13} \\ T^4 & T^8 & T & T^2 & T^{12} & T^{14} & T^3 & T^{11} & T^9 & T^{13} & T^6 & T^7 \end{bmatrix}$$

$$\begin{matrix} I & I & 0 & 0 & I & 0 & 0 \\ I & T^5 & T^5 & T^{10} & 0 & I & 0 \\ I & T^5 & T^{10} & T^5 & 0 & 0 & I \end{matrix}$$

FIG. 5

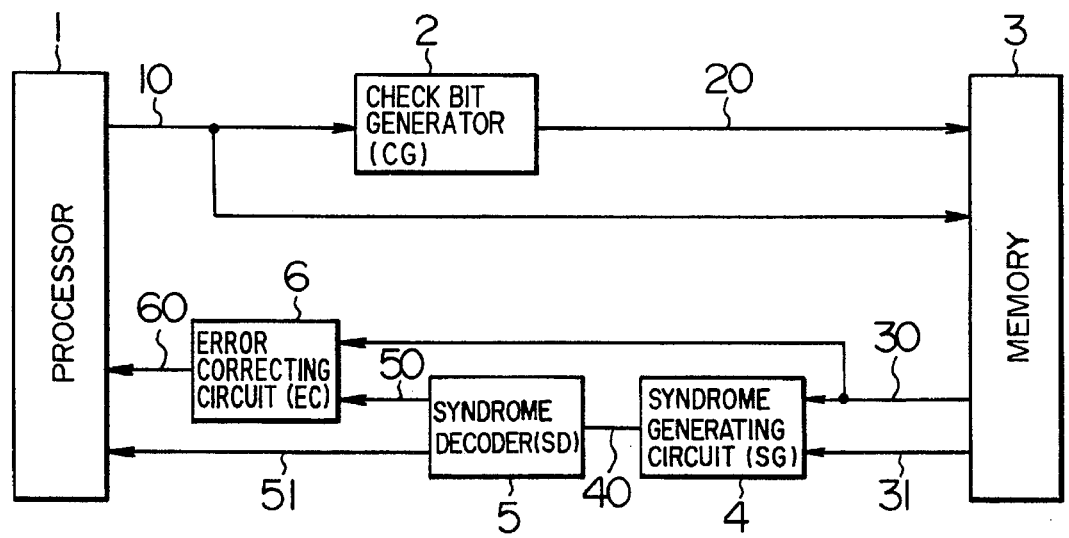

FIG. 6

$$H_1'' = \begin{bmatrix} D_0 & D_1 & D_2 & D_3 & D_4 & D_5 & D_6 & D_7 & D_8 & D_9 & D_{10} & D_{11} & D_{12} & D_{13} & D_{14} & D_{15} & C_0 & C_1 & C_2 \\ 1 & 1 & 1 & 1 & 1 & 1 & 1 & 1 & 1 & 1 & 1 & 1 & 1 & 1 & 0 & 0 & 1 & 0 & 0 \\ T^4 & T^4 & T^4 & T^4 & T^8 & T^8 & T^8 & T^8 & T^2 & T^2 & T^2 & T^2 & T & T & 1 & 1 & T & 1 & 1 \\ T^4 & T^8 & T & T^2 & T^4 & T^8 & T^2 & T & T^2 & T^4 & T & T^8 & T^4 & T^2 & T^8 & T^2 & T & T & T^4 \end{bmatrix}$$

ERROR DETECTING AND CORRECTING METHOD AND SYSTEM

BACKGROUND OF THE INVENTION

1. Field of the Invention

The present invention relates to a method of and an apparatus for detecting and correcting errors, and in particular to a method of and an apparatus for detecting and correcting errors suitable for a memory including memory elements each constituted of a plurality of bits.

2. Description of the Related Art

With increase in the memory capacity of memory elements, there has been increasingly required a b-bit memory element achieving b-bit-at-a-time input and output operations. In this specification, the b-bit block is called a byte. Conventional error detecting and correcting methods applicable to a memory configured with such b-bit memory elements include, for example, ① a method adopting single bit error correction—double bit error detection—single b-bit byte error detection (SEC-DED-SbED) codes, ② a method utilizing single b-bit byte error correction (SbEC) codes, and ③ a method employing single b-bit byte error correction—double b-bit byte error detection (SbEC-DbED) codes.

However, in the code systems above, there exist problems to be solved as follows. Namely, although the SEC-DED-SbED code system can be implemented, when the value of b is around four, with check bits of which the number is substantially equal to that of check bits of the SED-DED code system widely used for a memory constituted of one-bit memory elements, the byte error correction cannot be accomplished. The SbEC code system possesses the byte error correcting capability, but it cannot support double bit error detection for detecting two bit errors each from different bytes. Although the SbEC-DbED code system has quite a high error control capability, a large number of check bits are needed.

To solve these problems, a system of single b-bit byte error correction—double bit error detection (SbEC-DED) codes in which a double bit error detecting function is added to the single byte error correcting function has been described in pages 17 to 22 of the Transactions of the IEICE of Japan, Vol. 91, No. 78 and in page 140 of the Proc. 1991, IEEE Int. Symp. on Inform. Theory, June 1991.

SUMMARY OF THE INVENTION

However, in regard to the number of check bits, the code system proposed in the article above is not satisfactory for practical applications. For example, 14 check bits are required in a case where b=4 and 64 data bits are to be processed. Namely, only a slight improvement is achieved as compared with the SbEC-DbED codes which require 16 check bits. Actually, in a memory structured with 4-bit memory elements, the number of memory elements for check bits cannot be reduced.

It is therefore an object of the present invention to provide a method of and an apparatus for detecting and correcting errors capable of removing the drawbacks of the prior art.

Another object of the present invention is to provide a method of and an apparatus for detecting and correcting errors achieving single byte error correction—double bit error detection with a reduced number of check bits, thereby solving the problem of the SbEC-DED codes.

According to an aspect of the present invention, the error detecting and correcting apparatus includes a unit for receiving an encoded word including a plurality of b-bit bytes (b is an integer not less than two) and for generating a syndrome from the encoded word according to a first parity check matrix $H_1$ and a unit for correcting errors in the received encoded word based on the syndrome. The first parity check matrix $H_1$ is $$H_1 = \left( \begin{array}{c|c|c|c|c} R(M, r) & \begin{matrix} 00\ldots 0 \\ R(M, r-1) \end{matrix} & \begin{matrix} 00\ldots 0 \\ 00\ldots 0 \\ R(M, r-2) \end{matrix} & \ldots & \begin{matrix} 00\ldots 0 \\ 00\ldots 0 \\ \ldots \\ 00\ldots 0 \\ R(M, 2) \end{matrix} \end{array} \right) \quad (1)$$

where, r is an integer equal to or more than two, 0 stands for a b×b all zero matrix, and $R(M,r)$ is $$R(M, r) = \begin{bmatrix} I & I & I & \ldots & I \\ a(0) & a(1) & a(2) & \ldots & a(n-1) \end{bmatrix} \quad (2)$$

where, I indicates a b×b binary identity matrix; $a(0), a(1), \ldots, a(n-1)$ are respectively different elements of a $(r-1)$-order direct product of M on assumption that M designates a residue class with respect to addition of a subfield $GF(2^d)$, of a Galois field $GF(2^b)$ consisting of power matrices of a companion matrix, d is a divisor of b, and $n=2^d \cdot (r-1)$. In this connection, an all zero matrix means a b×b binary matrix of which any element is binary 0.

In one example of the present invention, the correcting unit includes a unit for detecting errors in the received encoded word according to the syndrome, a unit for generating signals indicating, based on the syndrome, positions of errors in the received encoded word, and a unit for correcting, based on the signals, the errors detected in the received encoded word.

In one example according to the present invention, there is further disposed a unit for receiving information constituted of a plurality of b-bit bytes to be encoded and generating check bytes from the received information according to the first parity check matrix $H_1$. The syndrome generating unit receives an encoded word including the information and the check bytes and generates the syndrome from the received encoded word according to the first parity check matrix $H_1$.

In one example of the present invention, there is further included a unit for receiving information constituted of a plurality of b-bit bytes to be encoded and generating check bytes from the received information according to a parity check matrix obtained by elementary row operations on the first parity check matrix $H_1$. The syndrome generating means receives an encoded word including the information and the check bytes and generates the syndrome from the received encoded word according to the first parity check matrix $H_1$.

In one example of the present invention, the parity check matrix thus obtained from the first parity check matrix $H_1$ is a third parity check matrix $H_3$ obtained by shortening a second parity check matrix $H_2$ configured in a reduced echelon form by achieving elementary row operations on the first parity check matrix $H_1$.

In one example of the present invention, the syndrome generating means generates the syndrome from the received encoded word according to the parity check matrix obtained from the first parity check matrix $H_1$ by elementary row operations, column exchanges and/or shortening.

According to the present invention thus constituted, there can be provided an error detecting and correcting method conducting single byte error correction—double bit error detection with a reduced number of check bits as compared with the prior art.

BRIEF DESCRIPTION OF THE DRAWINGS

These and other objects and advantages of the present invention will become apparent by reference to the following description and accompanying drawings wherein:

FIG. 1 is a diagram showing a companion matrix T and power matrices thereof employed in an embodiment according to the present invention;

FIG. 2 is a diagram showing a parity check matrix $H_1$ of (80,68) S4EC-DED codes;

FIG. 3 is a diagram showing a parity check matrix $H_2$ of (80,68) S4EC-DED systematic codes;

FIG. 4 is a diagram showing a parity check matrix $H_3$ of (76,64) S4EC-DED systematic codes;

FIG. 5 is a block diagram showing an error detecting and correcting apparatus in which the present invention is applied to a memory;

FIG. 6 is a diagram showing the parity check matrix $H_3$ in binary form;

DESCRIPTION OF THE PREFERRED EMBODIMENTS

Figure 7:
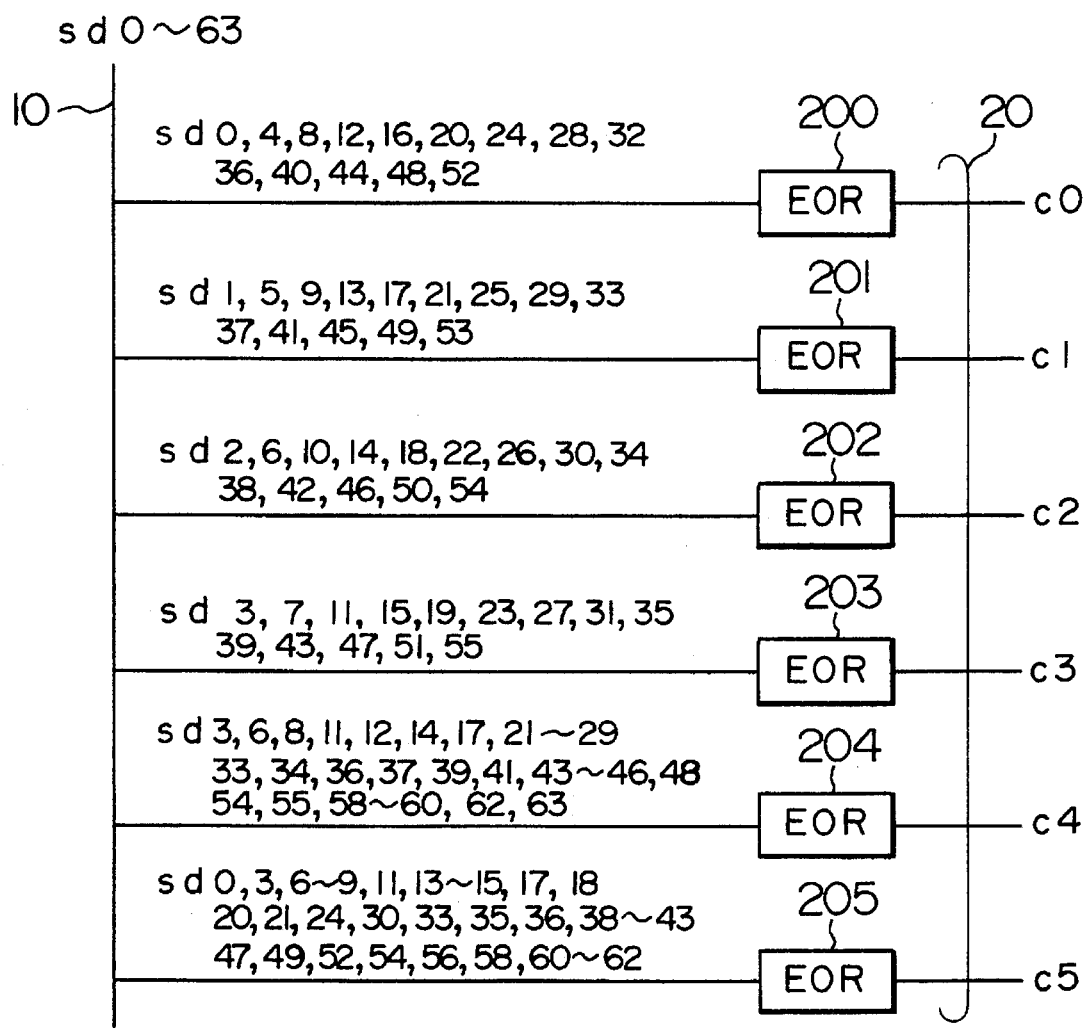
FIG. 7 is a diagram showing in detail a portion of a check bit generator.

Prior to description of embodiments of a method of and an apparatus for detecting and correcting errors according to the present invention, the principle of the present invention will be described.

First, description will be briefly given of mathematical fundamentals to prove that a first parity check matrix $H_1$ characteristic to the present invention is a parity check matrix of SbEC-DED codes.

[Definition 1]

A companion matrix T for a primitive polynomial $g(x)$ of degree b with coefficients in GF(2) is defined by the following binary matrix.

$$T = \begin{bmatrix} 0 & \cdots & 0 & g_0 \\ & & & g_1 \\ & I_{b-1} & & \cdot \\ & & & \cdot \\ & & & g_{b-1} \end{bmatrix} \quad (3)$$

where, $$g(x) = \sum_{i=0}^{b} g_i x^i, g_0 = g_b = 1$$

$I_{b-1}$: $(b-1) \times (b-1)$ binary identity matrixre,

[Property 1]

A set of power matrices of the companion matrix T constitutes a Galois field of $2^b$ elements as follows.

$$GF(2^b) = \{O, I, T, T^2, \ldots, T^{2^b-2}\}$$

[Property 2]

Assume that the elements of a subfield $GF(2^d)$ of $GF(2^b)$ are represented as $A(0), A(1), \ldots, A(n-1)$, where $n=2^d$. Then, the following matrix $H_0$ is a parity check matrix of SbEC-DED codes.

$$H_0 = \begin{pmatrix} I & I & \cdots & I \\ A(0) & A(1) & \cdots & A(n-1) \end{pmatrix} \quad (4)$$

[Property 3]

Even if $A(0), A(1), \ldots,$ and $A(n-1)$ are elements of a residue class M of the subfield $GF(2^d)$ of $GF(2^b)$ with respect to addition, the matrix $H_0$ of the expression (4) is a parity check matrix of SbEC-DED codes.

[Property 4]

The sum of two elements of the residue class M of the subfield $GF(2^d)$ of $GF(2^b)$ with respect to addition is an element of the subfield $GF(2^d)$, that is, $$A(i) + A(j) \in GF(2d) \quad (5)$$

where, $A(i), A(j) \in M$

The properties 1 and 2 have been described in pages 17 to 22 of the Transactions of the IEICE of Japan, Vol. 91, No. 78. The property 3 can be obtained by conducting elementary row operations on the matrix $H_0$ of the property 2. The property 4 has been commonly known for Galois fields.

Based on the properties above, the following property is attained for a matrix R(M,r).

[Property 5]

The matrix R(M,r) represented by the expression (2) is a parity check matrix of SbEC-DED codes.

Next, the property 5 will be proved. (1) For r=2, the matrix R(M,2) is identical to the matrix $H_0$ of the property 3, which obviously leads to the property 5. (2) for $r \geq 3$, since the matrix R(M,r) is easily understood to possess the SbEC function, the function of DED will only described. Assume that the DED function is missing. According to the first row and the i-th row ($i \geq 2$) of the matrix R(M,r), there exist non-zero binary error column vectors $e_1, e_2$, and $e_3$ of length b satisfying the following expressions.

$$e_1+e_2+e_3=0 \qquad (6)$$

$$A(i_1)\cdot e_1+A(i_2)\cdot e_2+A(i_3)\cdot e_3=0 \qquad (7)$$

where, $A(i_1)$, $A(i_2)$, and $A(i_3)$ are elements of the residue class M. According to the construction of the matrix R(M,r), the row order i can be selected such that either one of the following cases is possible.

(a) $A(i_1)$, $A(i_2)$, and $A(i_3)$ are different from each other.

(b) Two of these are equal to each other.

In the case (a), since the expressions (6) and (7) are identical to those applied to the matrix $H_0$ of the property 3 which has the SbEC-DED function, these expressions do not hold. In the case (b), assume $A(i_1)=A(i_2)\neq A(i_3)$ without loss of generality. The following expression is reduced from the expressions (6) and (7) by assigning $A(i_1)$ to $A(i_2)$.

$$\{A(i_1)+A(i_3)\}\cdot e_3=0 \qquad (8)$$

This however is inconsistent with $A(i_1)\neq A(i_3)$. Consequently, the matrix R(M,r) has the SbEC-DED function.

Subsequently, it will be proved that the first parity check matrix $H_1$ having the matrix R(M,r) as a sub-matrix thereof is a parity check matrix of SbEC-DED codes.

[Property 6]

The matrix $H_1=H(M,r)$ of the expression (1) is a parity check matrix of SbEC-DED codes. [Proof of property 6] The proof will be conducted by induction. (1) For r=2, the matrix H(M,2) is identical to the matrix R(M,2) and hence possesses the SbEC-DED function according to the property 5. (2) Assume that the property 6 is satisfied for r=k (k=2, 3, etc.). Then, the following matrix H(M,k+1) obviously has the SbEC function.

$$H(M,k+1) = \left( R(M,k+1) \left| \begin{matrix} 00\ldots 0 \\ H(M,k) \end{matrix} \right. \right) \qquad (9)$$

The DED function of the matrix H(M,k+1) will now be checked for four cases in which three non-zero error column vectors $e_1$, $e_2$, and $e_3$ are either on the side of submatrix R(M,k+1) or on the side of submatrix H(M,k). (a) When three vectors are on the side of H(M,k), the matrix H(M,k+1) has the DED function according to the assumption established in induction. (b) Consider a case where one vector $(e_1)$ is on the side of R(M,k+1) and two vectors $(e_2$ and $e_3)$ are on the side of H(M,k). If the DED function is assumed to be missing for the matrix H(M,k+1), the following inconsistency results according to the first row of the matrix H(M,k+1).

$$I\cdot e_1=0 \qquad (10)$$

(c) Consider a case where two vectors ($e_1$ and $e_2$) are on the side of R(M,k+1) and one vector ($e_3$) is on the side of H(M,k). If the DED function is assumed to be missing for the matrix H(M,k+1), the following expressions (11), (12), and (13) hold according to the first, i-th ($i\geq 2$), and j-th ($j\geq 3$) rows of the matrix H(M,k+1).

$$e_1+e_2=0 \qquad (11)$$

$$A(i_1)\cdot e_1+A(i_2)\cdot e_2=e_3 \qquad (12)$$

$$A(j_1)\cdot e_1+A(j_2)\cdot e_2=A(j_3)\cdot e_3 \qquad (13)$$

where $A(i_1), A(i_2), A(j_1), A(j_2), A(j_3) \in M$

Assigning the expression (11) to the expressions (12) and (13), there are obtained the following expressions.

$$\{A(i_1)+A(i_2)\}\cdot e_1=e_3 \qquad (14)$$

$$\{A(j_1)+A(j_2)\}\cdot e1=A(j_3)\cdot e_3 \qquad (15)$$

Since $e_3\neq 0$, dividing the expression (15) by the expression (14), there is obtained the following expression.

$$\{A(j_1)+A(j_2)\}/\{A(i_1)+A(i_2)\}=A(j_3) \qquad (16)$$

According to the property 4, $A(i_1)+A(i_2)$ and $A(j_1)+A(j_2)$ are elements of the subfield $GF(2^d)$ and the left side of the expression (16) as the quotient of the elements of subfield $GF(2^d)$ is also an element of the subfield $GF(2^d)$. On the other hand, the right side $A(j_3)$ of the expression (16) is an element of the residue class M. This is inconsistent with exclusiveness existing between the subfield $GF(2^d)$ and the residue class M. (d) In a case where three vectors $e_1$, $e_2$, and $e_3$ are on the side of R(M,k+1), the matrix H(M,k+1) has the DED function according to the property 5. This concludes the proof.

The maximum code length N of SbEC-DED codes associated with the matrix H(M,r) is represented as follows by the sum of matrix lengths of matrix R(M,i), where i=2, 3, . . . , r.

$$N = b\cdot 2^d \frac{2^{d(r-1)}-1}{2^d-1} \qquad (17)$$

In this regard, the SbEC-DED codes according to the present invention are linear codes as can be clearly seen from the construction thereof and hence have characteristics generally possessed by any other linear codes. Namely, the following facts of the linear codes have been commonly known to those skilled in the art. Even when there is used a matrix obtained by achieving elementary row operations on the matrix H(M,r), the general characteristics are preserved. In the matrix H, even when columns thereof are exchanged with each other in byte units, the SbEC-DED function is retained. For the encoding operation, a parity check matrix of a reduced echelon form is suitably used; moreover, even when the matrix is converted into a shortened form, the performance thereof is not deteriorated. The reduced echelon forms include one attained by conducting elementary row operations on the matrix H, one developed by exchanging columns of the matrix with each other in byte units, and one obtained by shortening the matrix.

Next, referring to the drawings, description will be given of an embodiment according to the present invention.

First, a method of configuring the first parity check matrix $H_1$ will be described in a case of, for example, b=4 and r=3. In this example, the following primitive polynomial g(x) is adopted as the generator polynomial.

$$g(x)=x^4+x+1$$

The companion matrix T and power matrices thereof are obtained according to the definition 1 as shown in FIG. 1. Based on the property 1, a group of matrices of FIG. 1 and an all zero matrix 0 constitute a Galois field $GF(2^4)$ as follows.

$$GF(2^4)=\{O, I, T, T^2, T^3, \ldots, T^{14}\}$$

Moreover, a subfield $GF(2^2)$ thereof is represented as $$GF(2^2)=\{O, I, T^5, T^{10}\}$$

Adding T, $T^3$, and $T^6$ to each element of the subfield $GF(2^2)$ in a respective manner, there are obtained three kinds of residue classes as follows.

$$M_1=\{T, T^2, T^4, T^8\}$$

$$M_3=\{T^3, T^{11}, T^{12}, T^{14}\}$$

$M_6=\{T^6, T^7, T^9, T^{13}\}$

In this embodiment, assuming that $M_1$ is to be used, a parity check matrix $H_1$ is attained for (80,68)S4EC-DED codes of FIG. 2 in accordance with the expression (1).

The parity check matrix $H_2$ of FIG. 3 is developed by accomplishing elementary row operations on the parity check matrix $H_1$ of FIG. 2 to attain the following three columns.

$$\begin{pmatrix} I \\ 0 \\ 0 \end{pmatrix} \begin{pmatrix} 0 \\ I \\ 0 \end{pmatrix} \begin{pmatrix} 0 \\ 0 \\ I \end{pmatrix}$$

The matrix $H_2$ is also a parity check matrix of (80,68)S4EC-DED codes. Rearranging columns such that these three columns constitute a 12×12 binary identity matrix on the right end in the matrix $H_2$, a reduced echelon form is attained.

A parity check matrix $H_3$ of FIG. 4 is configured by deleting from the parity check matrix $H_2$ of FIG. 3 a column $$\begin{pmatrix} I \\ T^{10} \\ T^{10} \end{pmatrix}$$

which has many binary 1s and then exchanging columns with each other. The matrix $H_3$ thus obtained is a parity check matrix of (76,64)S4EC-DED systematic codes.

Next, description will be given of the configuration and operation of an embodiment in which the error detecting and correcting method using the parity check matrix of FIG. 4 is applied to a memory.

Figure 6:
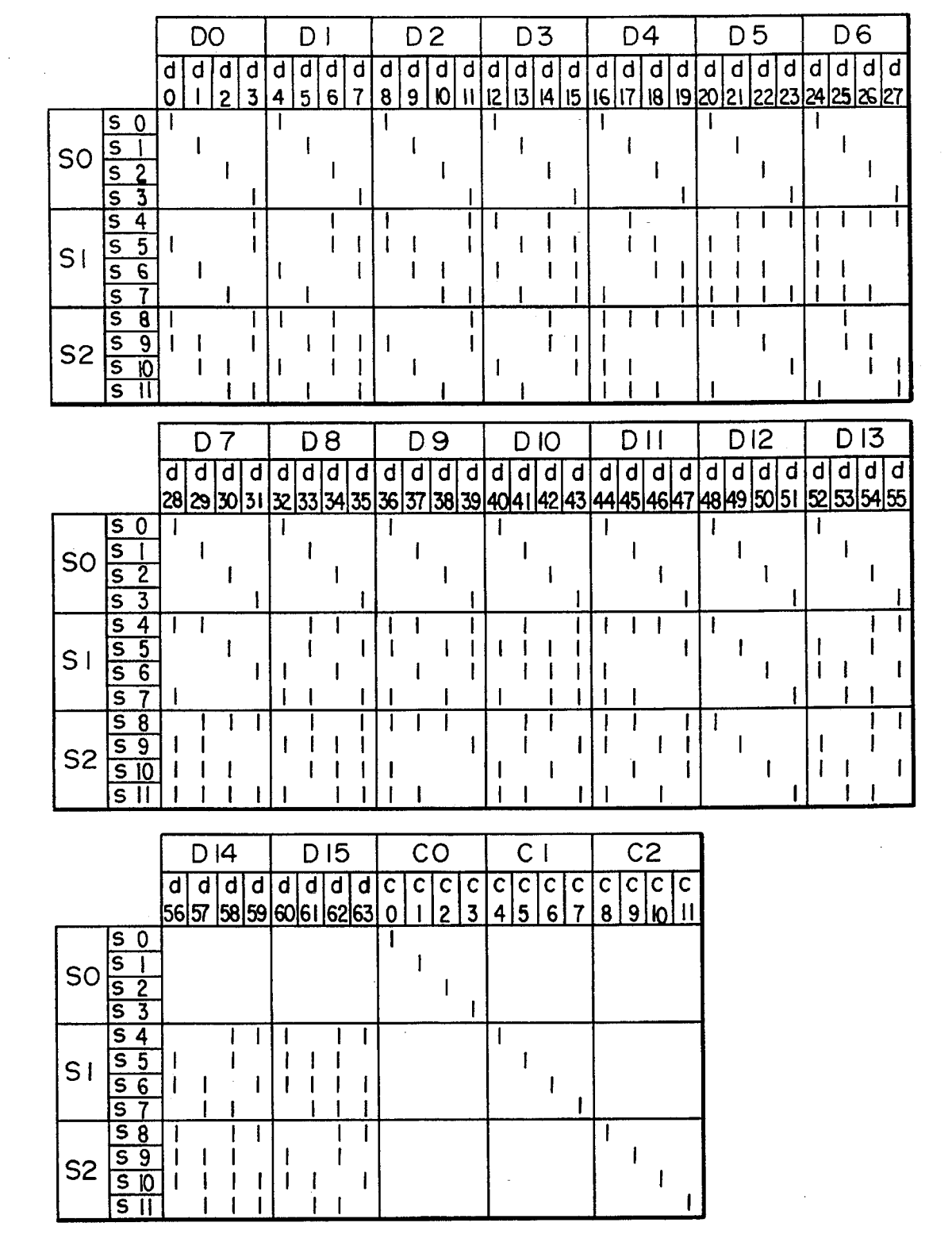

FIG. 5 shows in a block diagram the constitution of the embodiment above in which the present invention is applied to a memory. The configuration includes a processor 1, a check bit generator (CG) 2, a memory 3, a syndrome generator (SG) 4, a syndrome decoder (SD) 5, and an error correcting circuit (EC) 6. In this system, signals are encoded as follows. On receiving 64-bit write data (sd0 to sd63) 10 from the processor 1, the check bit generator (CG) produces 12 check bits (c0 to c11) according to the parity check matrix $H_3$. The obtained check bits 20 are sent together with the write data 10 to the memory 3 to be written therein. The signals are thereafter decoded in the following procedure. First, 64-bit data (fd0 to fd63) 30 and 12 check bits (fc0 to fc11) 31 are read from the memory 3 to be delivered to the syndrome generator (SG) 4. Based on the parity check matrix $H_3$, the generator 4 creates 12-bit syndrome (s0 to s11) 40. The syndrome decoder (SD) 5 decodes the syndrome 40 according to the parity check matrix $H_3$ to generate error report signals (CE and UCE) 51 so as to send the signals to the processor 1. Moreover, the syndrome decoder 5 produces error position indicating signals 50. The error correcting circuit (EC) 6 corrects the data 30 depending on the signals 50 and then feeds the corrected data (cd0 to cd63) 60 to the processor 1. FIG. 6 shows the parity check matrix $H_3$ in binary form. This structure is developed by assigning the binary representation of FIG. 1 to I, T, $T^2$, etc. of FIG. 4. In FIG. 6, D0 to D15 indicate data in the byte representation and d0 to d63 denote data in the bit representation. It can be seen from the layout, for example, that a data byte D0 is constituted with data bits d0 to d3. Furthermore, C0 to C2 designate check bits in the byte representation, c0 to c11 indicate check bits in the bit representation, S0 to S2 stand for syndrome in the byte representation, and s0 to s11 denote syndrome in the bit representation. The layout further shows correspondences between these bytes and bits.

Figure 8:
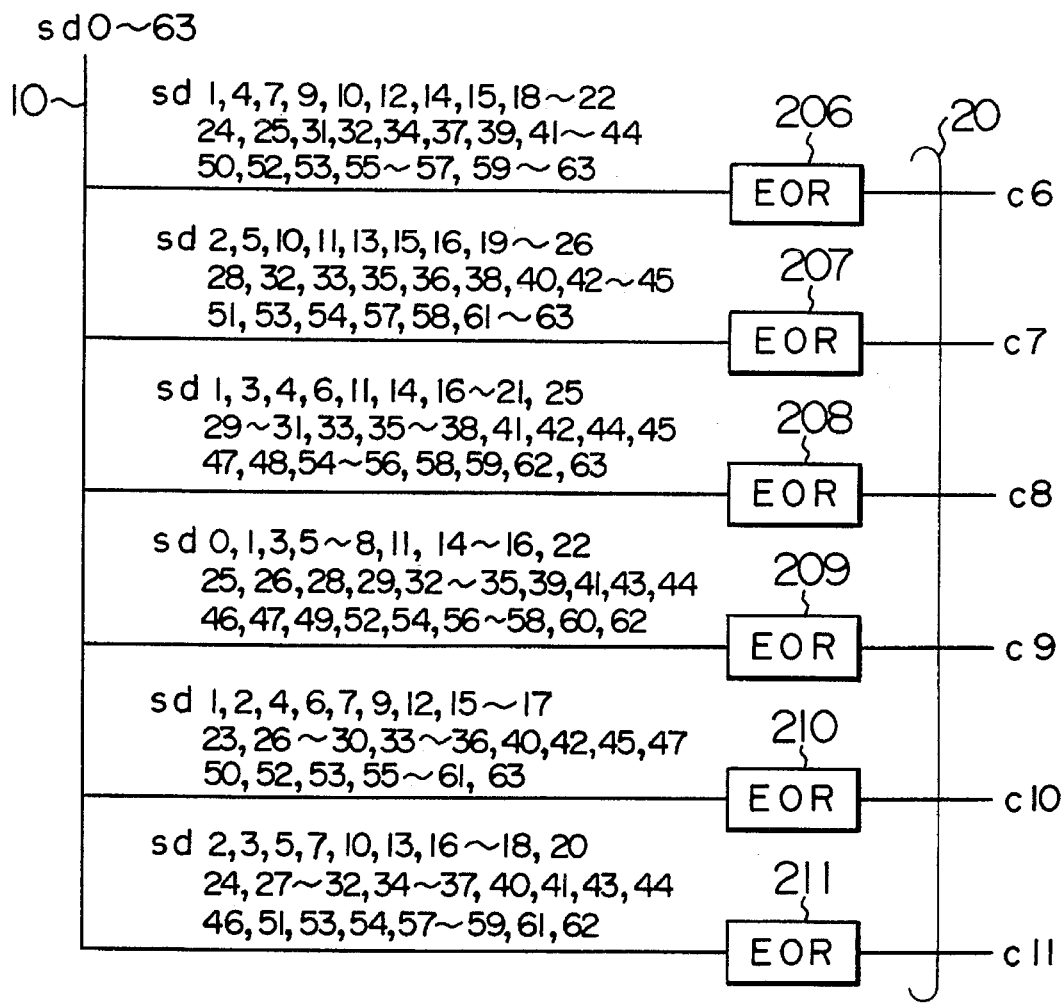
FIG. 8 is a diagram showing in detail another portion of the check bit generator.

FIGS. 7 and 8 show in detail the configuration of the check bit generator (CG) 2 including exclusive OR (EOR) circuits 200 to 211. Each check bit is generated, for each associated row of the parity check matrix $H_3$ of FIG. 6, by achieving EOR operations with any data bit "1" thereof. For example, the check bit c0 is created by conducting EOR operations for each of 14 bits of write data sd0, sd4, sd8, sd12, sd16, sd20, sd24, sd28, sd32, sd36, sd40, sd44, sd48, and sd52.

Figure 9:
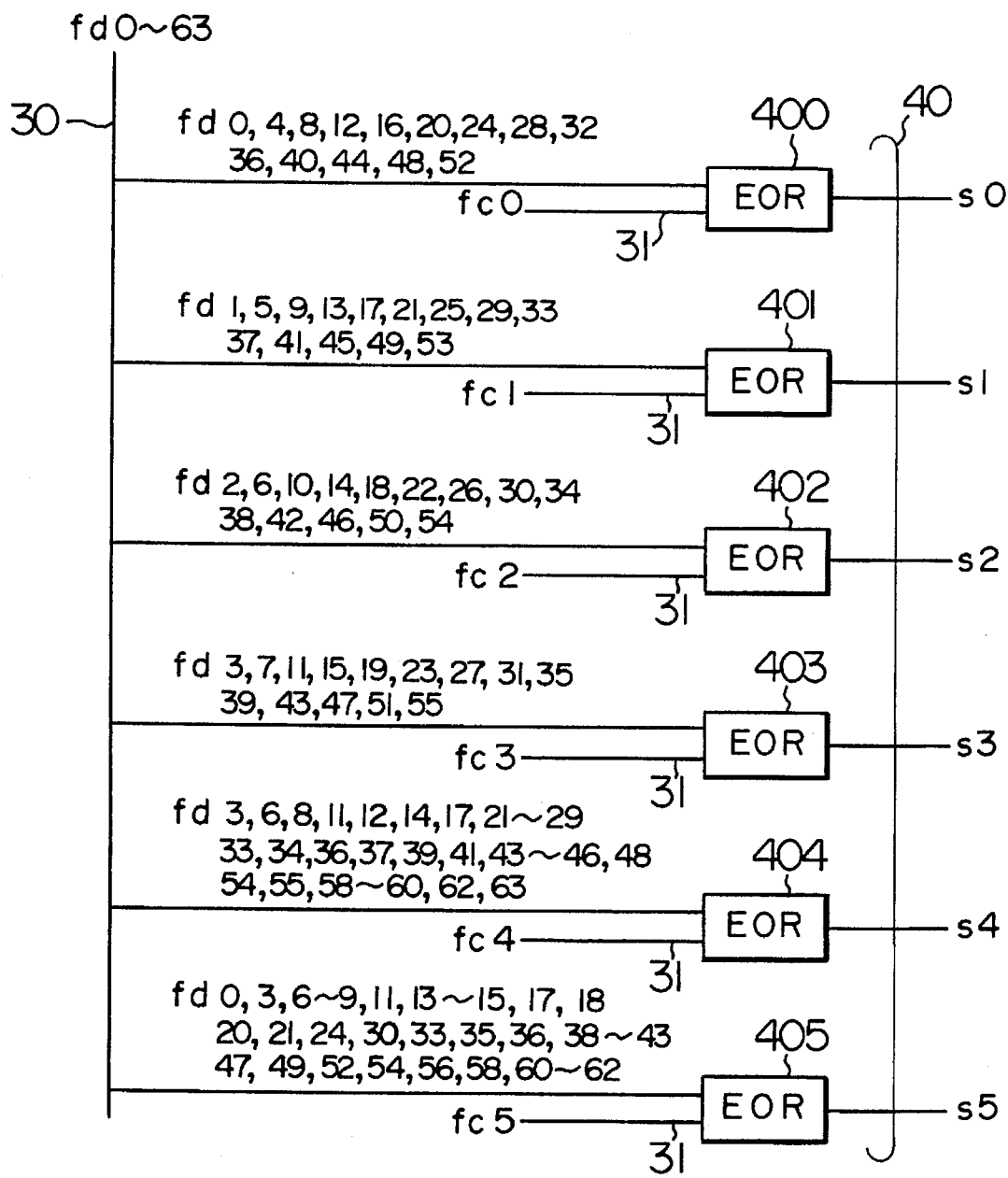
FIG. 9 is a diagram showing in detail a portion of a syndrome generator.
Figure 10:
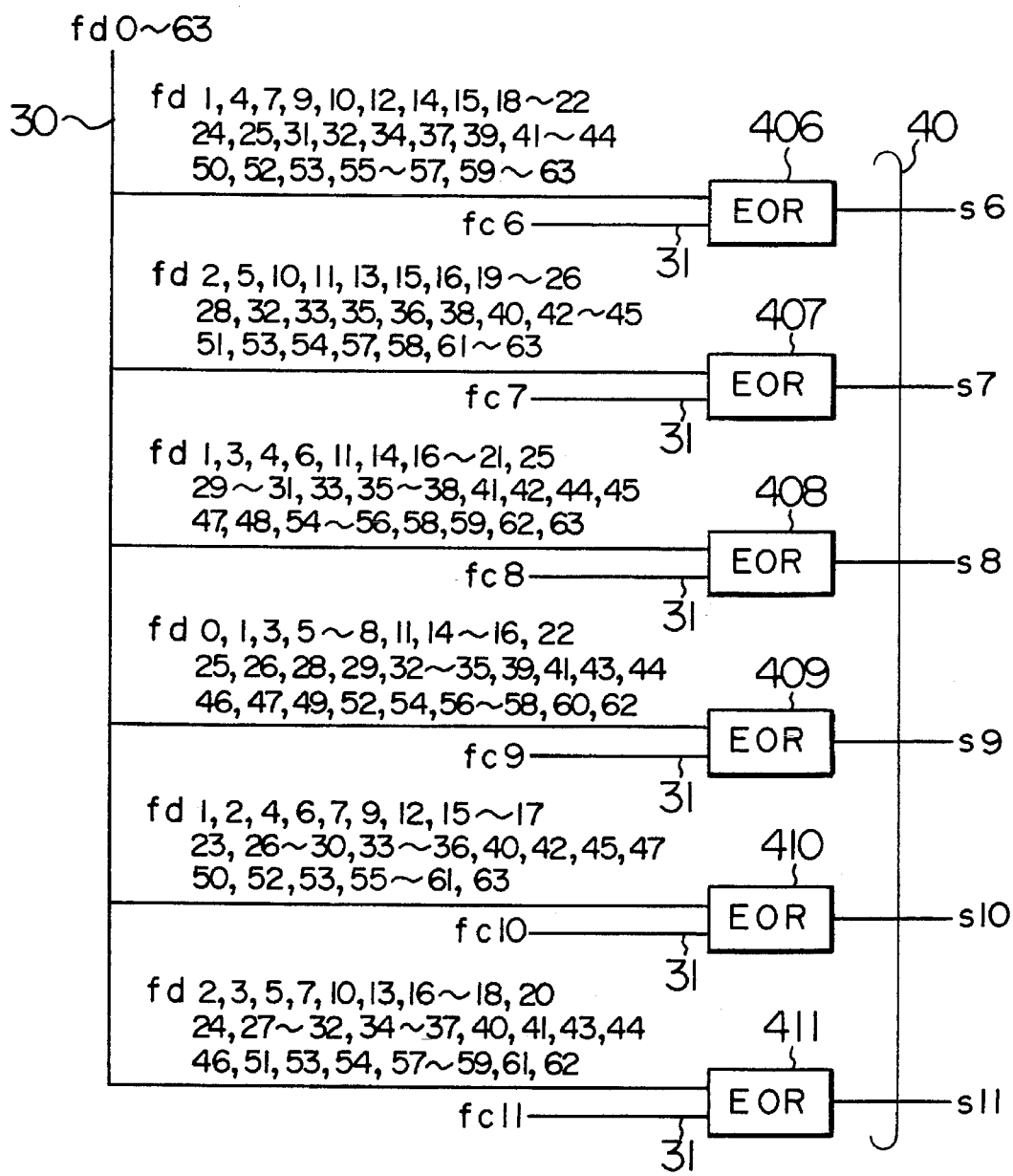
FIG. 10 is a diagram showing in detail another portion of the syndrome generator.
Figure 11:
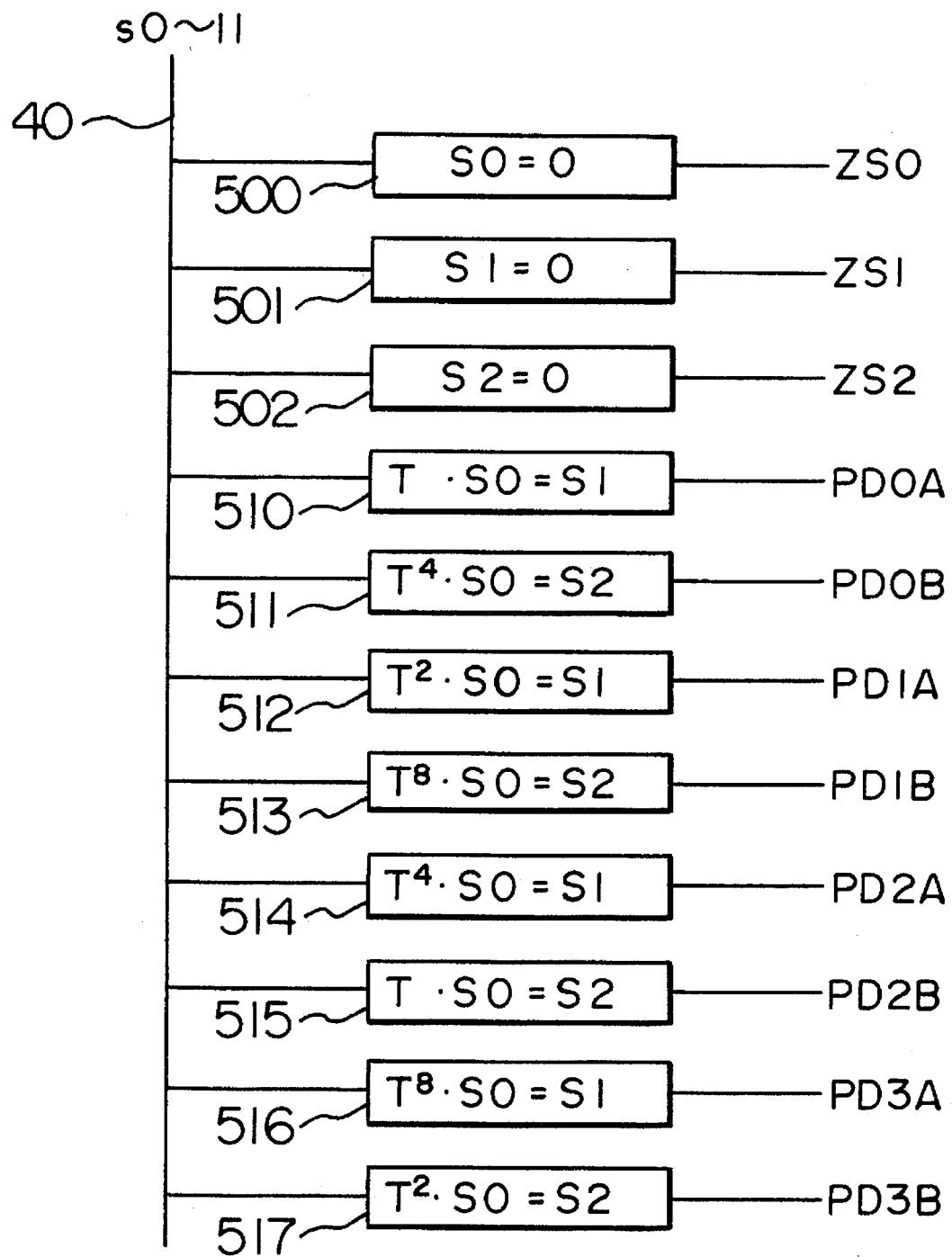
FIG. 11 is a diagram showing a portion of a syndrome decoder.
Figure 12:
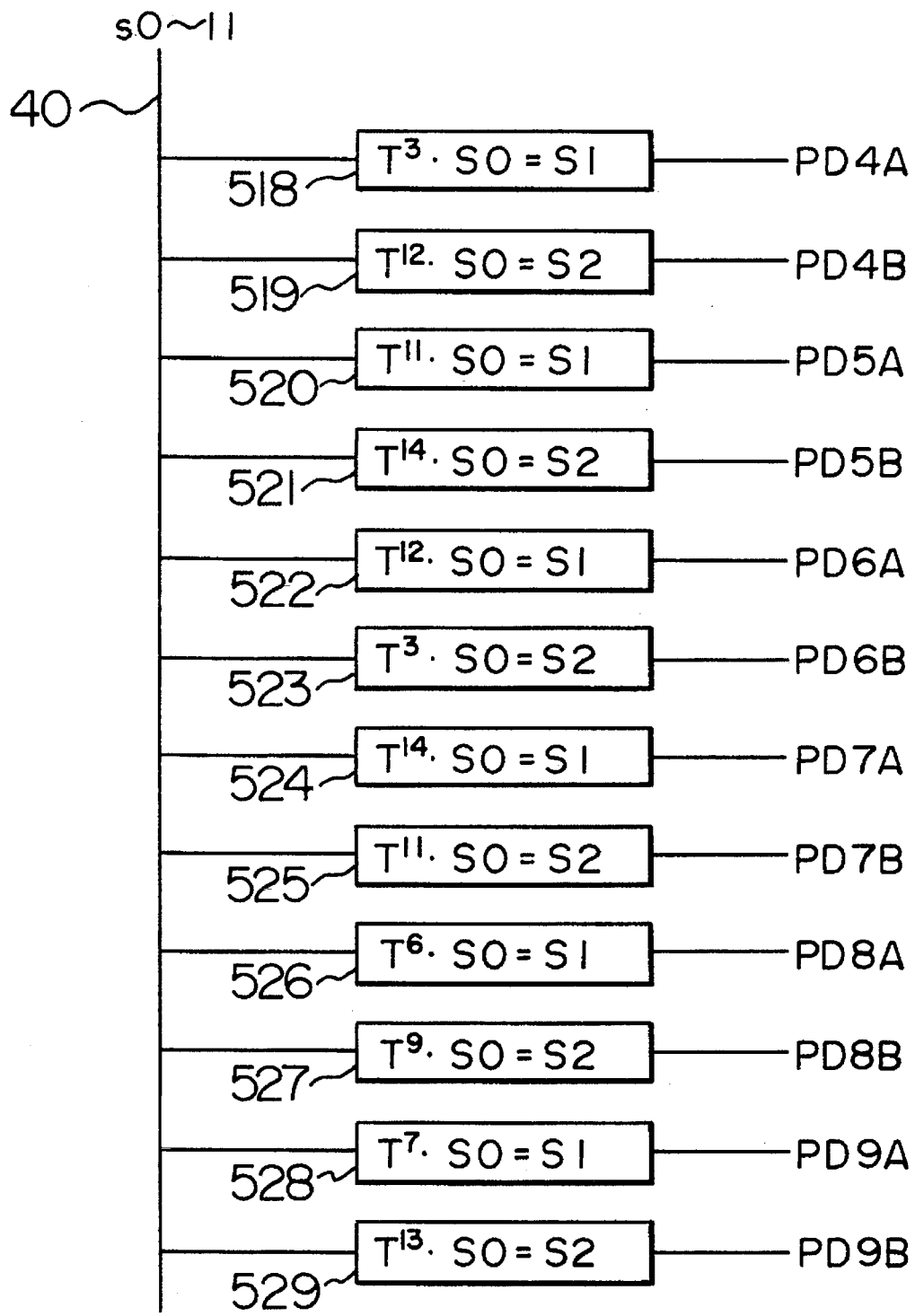
FIG. 12 is a diagram showing another portion of the syndrome decoder.
Figure 13:
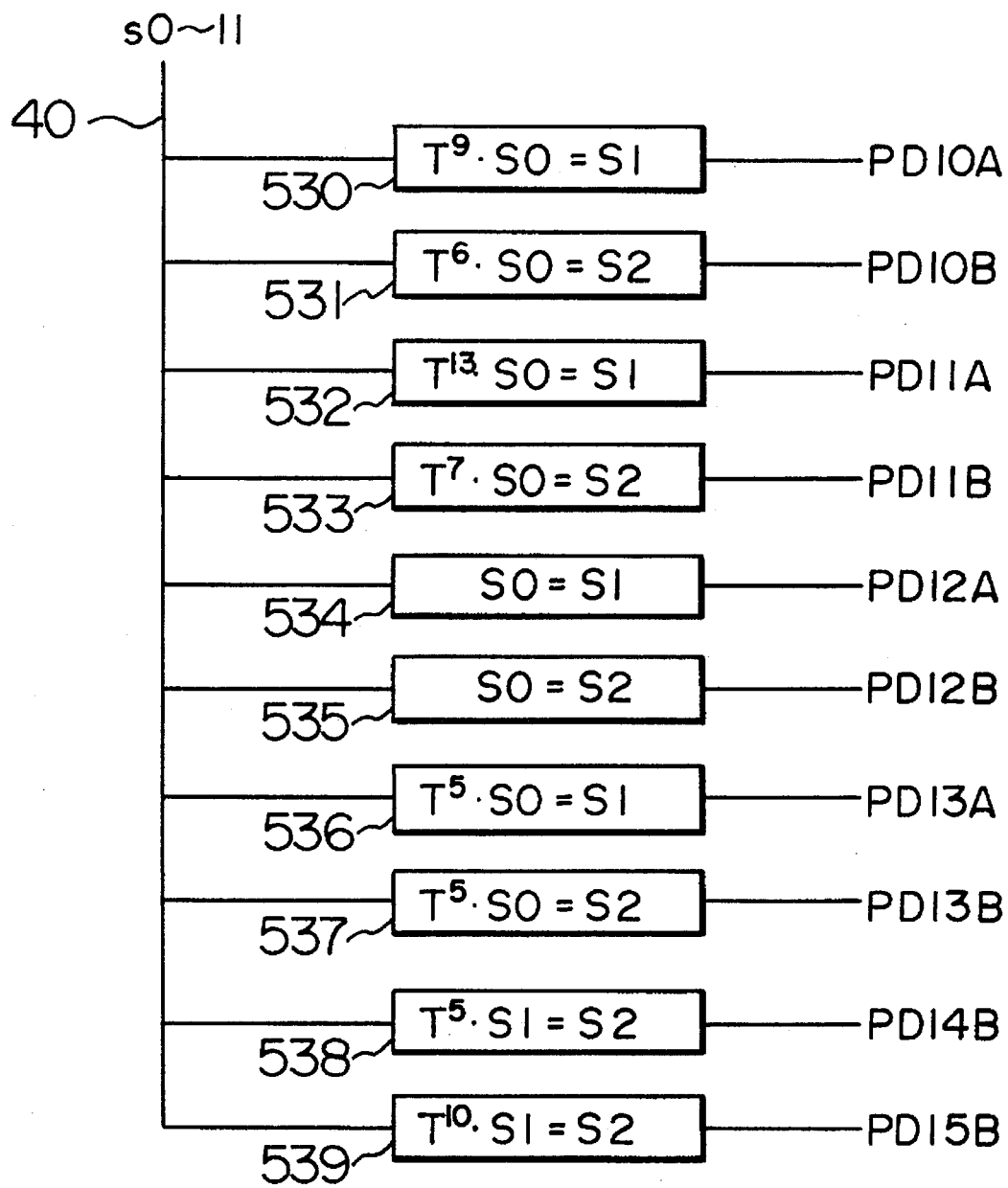
FIG. 13 is a diagram showing still another portion of the syndrome decoder.
Figure 14:
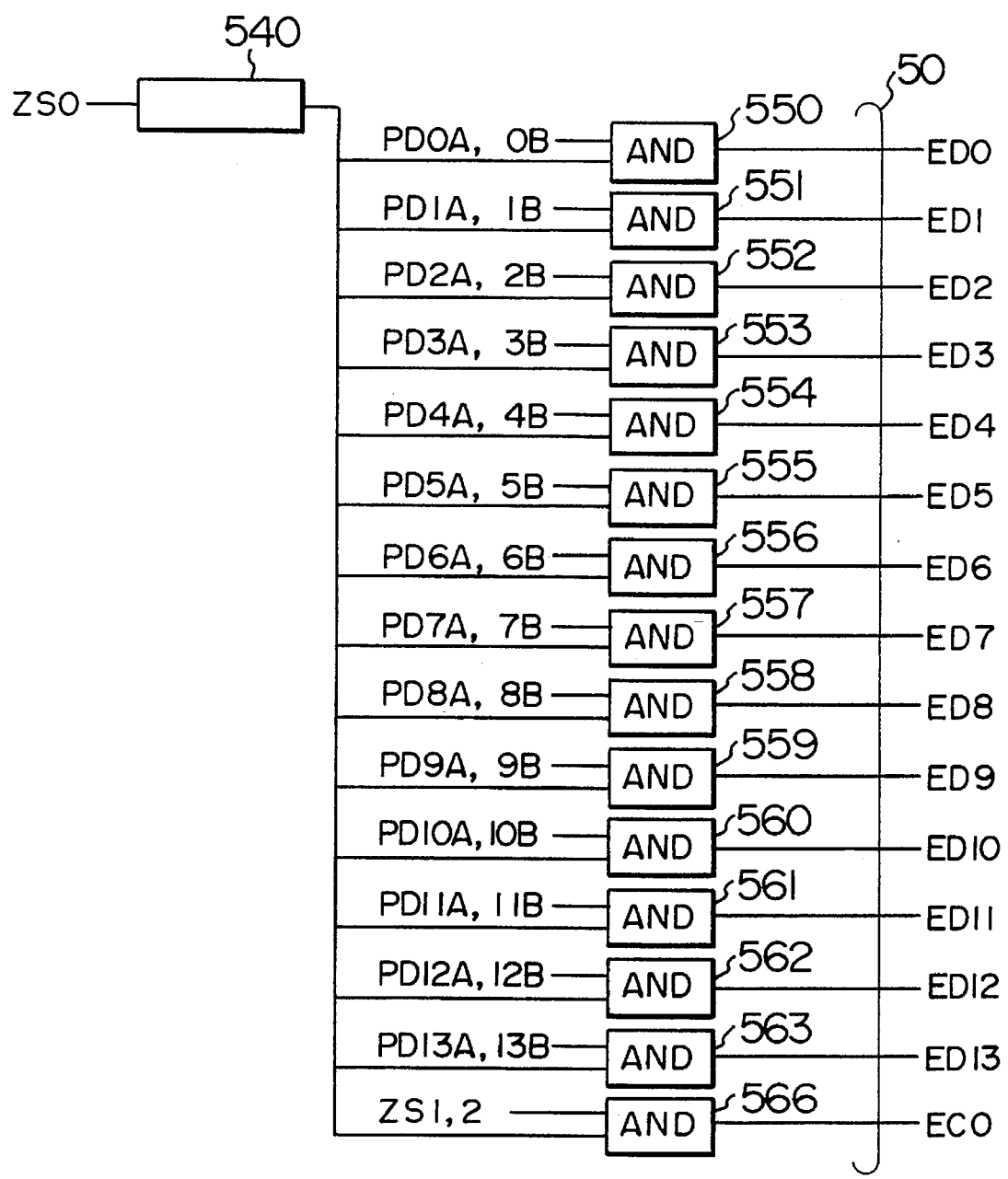
FIG. 14 is a diagram showing further portion of the syndrome decoder.
Figure 15:
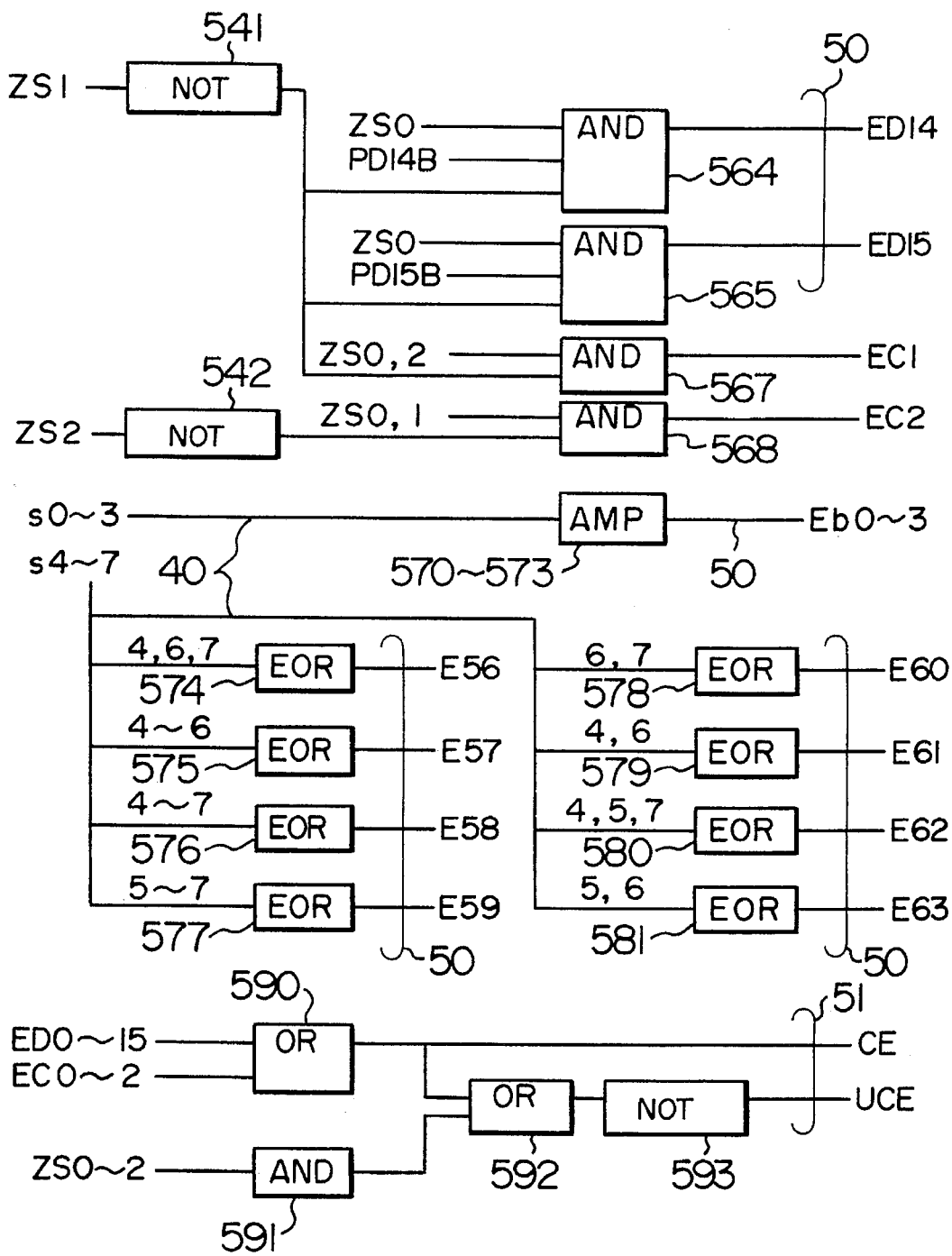
FIG. 15 is a diagram showing another portion of the syndrome decoder.

FIGS. 9 and 10 show details of the syndrome generator (SG) 4 constituted with EOR circuits 400 to 411. Each syndrome bit is produced, for each associated row of the parity check matrix $H_3$ of FIG. 6, by executing EOR operations between a check bit and any data bit having a value of one. For example, the syndrome bit s0 is created by accomplishing EOR operations between the read check bit fc0 and 14 read data bits fd0, fd4, fd8, fd12, fd16, fd20, fd24, fd28, fd32, fd36, fd40, fd44, fd48, and fd52.

Subsequently, description will be given of a method of decoding syndrome for single byte error correction. As an example, it is assumed that only the D0 byte of read data contains an error pattern expressed by a column vector $e_0$. Under this condition, syndrome bytes s0, S1, and S2 are generated according to the parity check matrix $H_3$ as follows.

$$S0=I \cdot e_0 \quad (18)$$

$$S1=T \cdot e_0 \quad (19)$$

$$S2=T4 \cdot e_0 \quad (20)$$

These expressions (18) to (20) leads to the following relationships between S0, S1, and S2.

$$S0=e_0 \neq 0 \quad (21)$$

$$S1=T \cdot S0 \quad (22)$$

$$S2=T^4 \cdot S0 \quad (23)$$

When these expressions (21) to (23) are satisfied, it can be considered that the D0 byte contains errors and the error pattern is represented as S0. For the other bytes, decoding conditions are similarly decided so as to thereby resultantly obtain a syndrome decoding table as follows.

TABLE 1

| Syndrome decoding table | | | | |
|---|---|---|---|---|
| Error byte | S0 | S1 | S2 | Error pattern |
| D0 | ≠0 | T.S0 | $T^4$.S0 | S0 |
| D1 | ≠0 | $T^2$.S0 | $T^8$.S0 | S0 |
| D2 | ≠0 | $T^4$.S0 | T.S0 | S0 |
| D3 | ≠0 | $T^8$.S0 | $T^2$.S0 | S0 |
| D4 | ≠0 | $T^3$.S0 | $T^{12}$.S0 | S0 |
| D5 | ≠0 | $T^{11}$.S0 | $T^{14}$.S0 | S0 |
| D6 | ≠0 | $T^{12}$.S0 | $T^3$.S0 | S0 |
| D7 | ≠0 | $T^{14}$.S0 | $T^{11}$.S0 | S0 |
| D8 | ≠0 | $T^6$.S0 | $T^9$.S0 | S0 |
| D9 | ≠0 | $T^7$.S0 | $T^{13}$.S0 | S0 |
| D10 | ≠0 | $T^9$.S0 | $T^6$.S0 | S0 |
| D11 | ≠0 | $T^{13}$.S0 | $T^7$.S0 | S0 |
| D12 | ≠0 | S0 | S0 | S0 |
| D13 | ≠0 | $T^5$.S0 | $T^5$.S0 | S0 |
| D14 | 0 | ≠0 | $T^5$.S1 | $T^{10}$.S1 |
| D15 | 0 | 0 | $T^{10}$.S1 | $T^5$.S1 |
| C0 | ≠0 | 0 | 0 | S0 |
| C1 | 0 | ≠0 | 0 | S1 |
| C2 | 0 | 0 | ≠0 | S2 |

FIGS. 11 to 15 show a detailed structure of the syndrome decoder (SD) 5 including circuits 500 to 502 and 510 to 539 for detecting that each condition in Table 1 is true, NOT circuits 540 to 542, AND circuits 550 to 568 for creating error byte indication signals, amplifier (AMP) circuits 570 to 573 and EOR circuits 574 to 581 for producing error bit indication signals, and circuits 590 to 593 for generating error report signals. On receiving syndrome 40, the decoder 5 produces error position indicating signals 50 and error report signals 51. Each of the amplifier circuits 570 to 573 is a gate circuit for simply passing a received signal therethrough.

Figure 16:
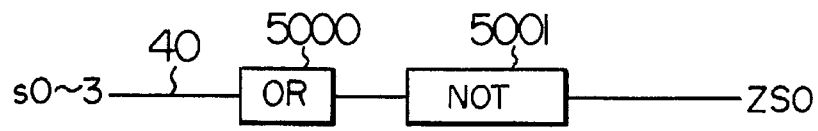
FIG. 16 is a diagram showing in detail the configuration of a circuit 500.

The signals 50 include error byte indication signals ED0 to ED15 and EC0 to EC2 and error bit indication signals Eb0 to Eb3 and E56 to E63. Each error byte indication signal satisfies the condition of the each row of the syndrome decoding table (Table 1.) For example, the error byte indication signal ED0 is obtained as an output from the AND circuit 550. In more detail, on receiving a signal attained by inverting by the NOT circuit 540 the output ZS0 from the circuit 500 detecting a condition of S0=0, the output PD0A from the circuit 510 detecting a condition of T·S0=S1, and the output PD0B from the circuit 511 detecting a condition of $T^4 \cdot S0 = S2$, the AND circuit 550 outputs the error byte indication signal ED0. The signal ED0 satisfies the conditions related to the row of the error byte D0 in the table. This also applies to the other error byte indication signals. In this situation, the circuit 500 detecting S0=0 is required to have output value 1 only when each of the syndrome bits s0 to s3 is 0 and hence can be configured with an OR circuit 5000 receiving s0 to s3 as inputs thereto and a NOT circuit 5001 inverting an output therefrom as shown in FIG. 16. This is also the case of the circuits 501 and 502. Moreover, the circuit 510 detecting T·S0=S1 conducts the following operations according to FIGS. 1 and 6.

$$\begin{pmatrix} 0001 \\ 1001 \\ 0100 \\ 0010 \end{pmatrix} \begin{pmatrix} s0 \\ s1 \\ s2 \\ s3 \end{pmatrix} = \begin{pmatrix} s4 \\ s5 \\ s6 \\ s7 \end{pmatrix} \quad (24)$$

Figure 17:
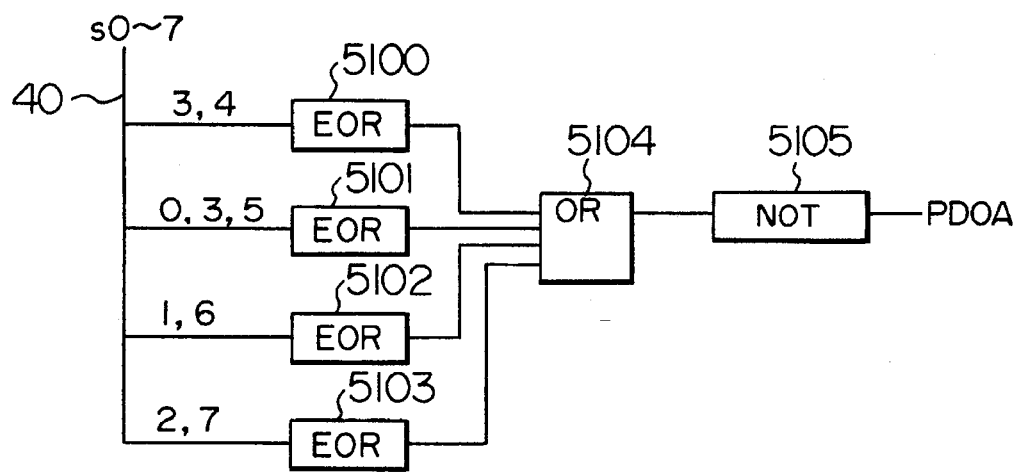
FIG. 17 is a diagram showing in detail the constitution of a circuit 510.

Performing the multiplication in the expression (24) leads to the following condition for the syndrome bits s0 to s7. Namely, it is necessary for the circuit 510 to obtain output value 1 only when each of s3+s4, s0 +s3+s5, s1+s6, and s2+s7 is 0. Consequently, the circuit 510 can be constructed as shown in FIG. 17. This also applies to the circuits 511 to 539. The error bit indication signals Eb0 to Eb3 for the data bytes D0 to D13 are identical to the syndrome bits s0 to s3. The error bit indication signals E56 to E59 for the data byte D14 are represented as $T^{10} \cdot S1$ according to the syndrome decoding table and hence are represented as follows in accordance with the binary form thereof.

$$\begin{aligned} E56 &= s4 \quad\quad\; + s6 + s7 & (25) \\ E57 &= s4 + s5 + s6 & (26) \\ E58 &= s4 + s5 + s6 + s7 & (27) \\ E59 &= \quad\quad\; s5 + s6 + s7 & (28) \end{aligned}$$

Namely, these signals can be produced by EOR circuits 574 to 577. Similarly, the error bit indication signals E60 to E63 for the data byte D15 can also be generated by EOR circuits 578 to 581. The error report signals 51 include a correctable error report signal CE which is set to 1 when a single byte error is detected and an uncorrectable error report signal UCE which is set to 1 when any other error is detected. The signal CE can be created from an OR circuit 590 which receives as inputs thereto the error byte indication signals ED0 to ED15 and EC0 to EC2. The signal UCE need only be set to 1 in any cases excepting the case where each signal of the syndrome is 0 (namely, the signals do not contain any error) and the case where the signal CE is one. Consequently, the signal UCE can be generated by circuits 591 to 593.

Figure 18:
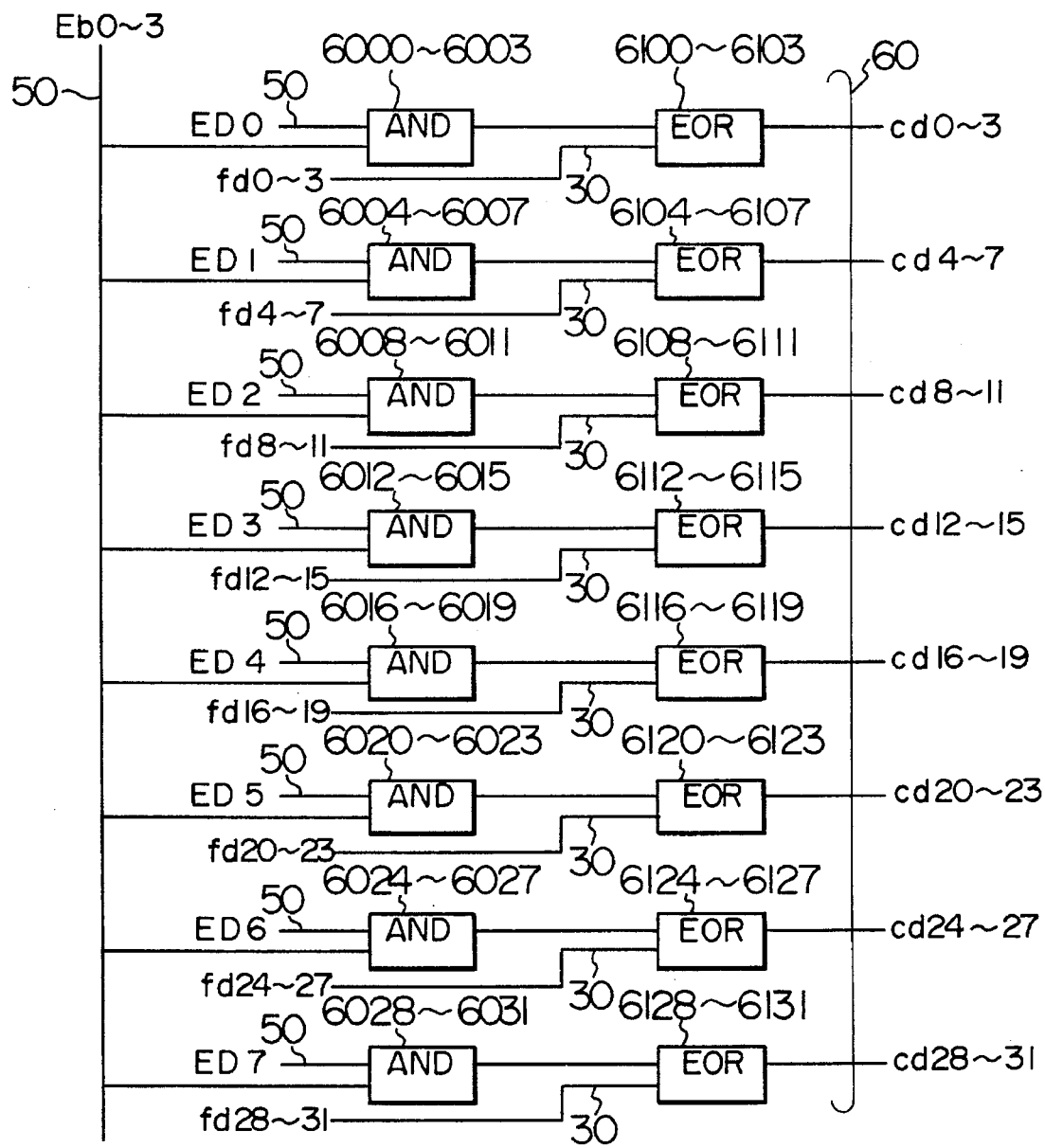
FIG. 18 is a diagram showing in detail a portion of an error correcting circuit.
Figure 19:
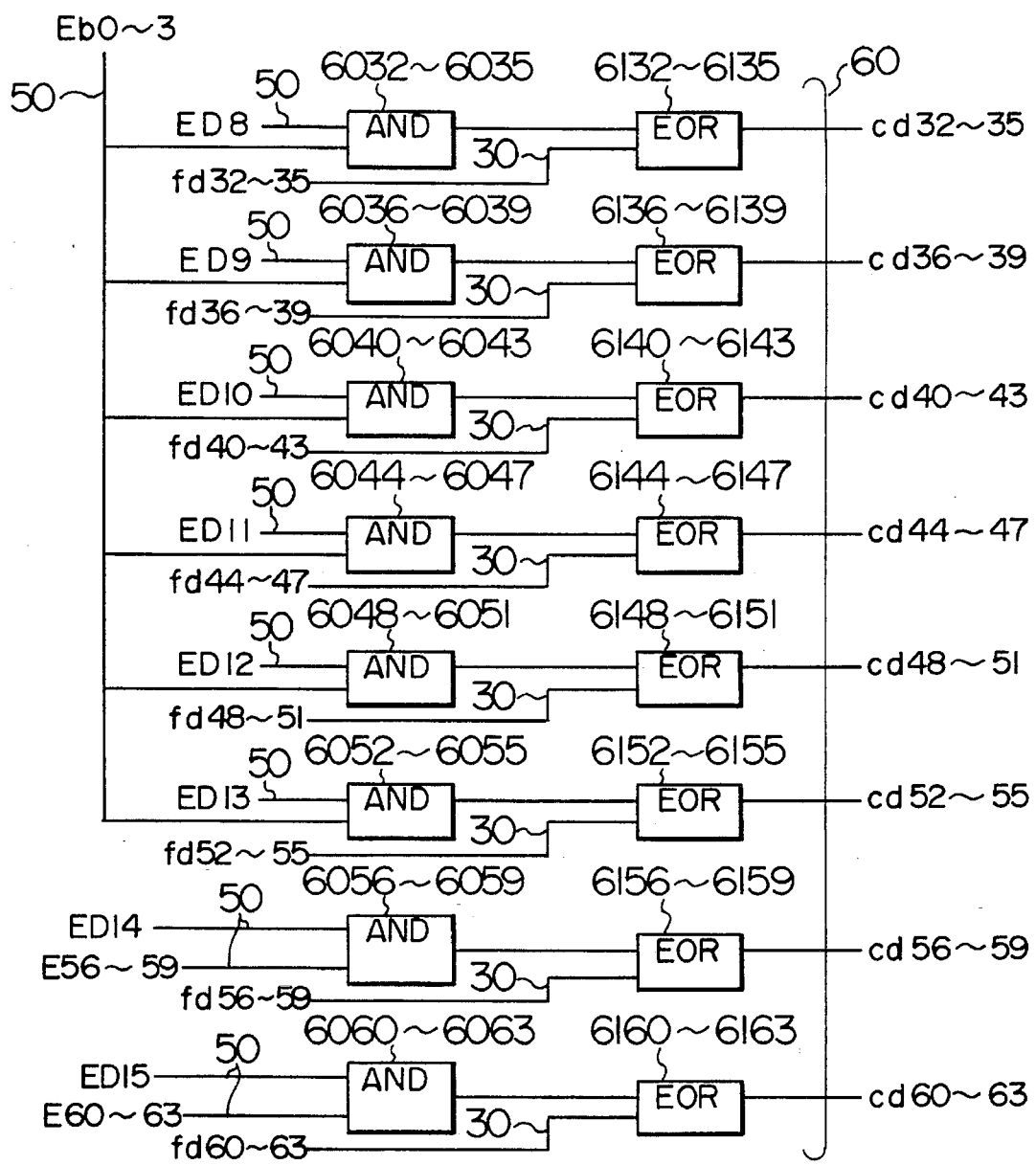
FIG. 19 is a diagram showing in detail another portion the error correcting circuit.

FIGS. 18 and 19 shows a detailed configuration of the error correcting circuit (EC) 6. The circuit 6 includes AND circuits 6000 to 6063 respectively receiving as inputs thereto the error byte indication signals ED0 to ED15 and the error bit indication signals Eb0 to Eb3 and E56 to E63 to produce inversion indication signals for each data bits and EOR circuits 6100 to 6163 for inverting the read data signals fd0 to fd63 in response to the inversion indication signals, respectively. With this provision, for example, the read data signal fd0 is inverted when both of the error byte indication signal ED0 and the error bit indication signal Eb0 are 1.

Figure 20:
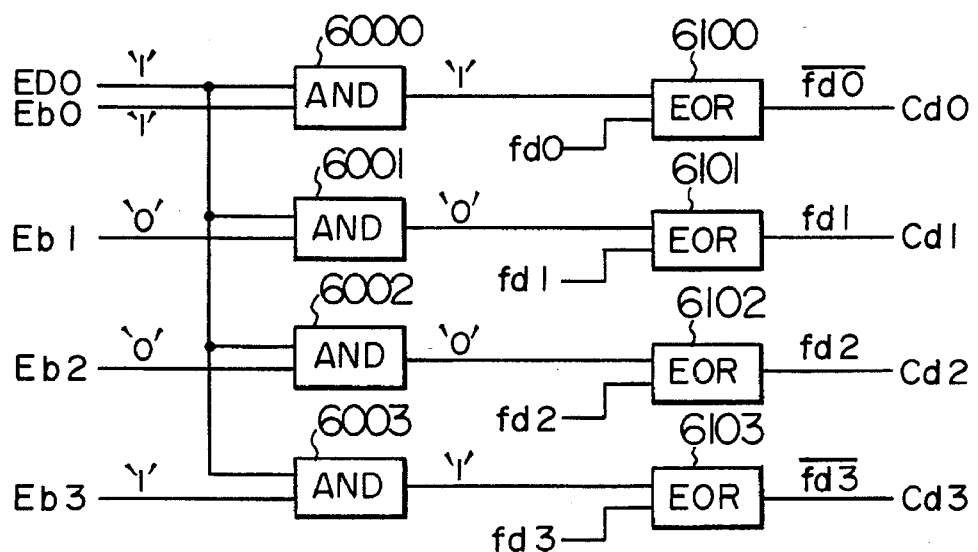
FIG. 20 is a diagram showing in detail a portion of the error correcting circuit.

In this connection, FIG. 20 shows in detail portions of the error correction circuit 6 shown in FIGS. 18 and 19.

In this diagram, there are shown relationships between input and output terminals of the AND circuits 6000 to 6003 and the EOR circuits 6100 to 6103 of FIG. 18 by way of example. It is assumed that ED0 is "1", each of ED1 to ED15 is "0", and Eb0 to Eb3 are set to "1001" in this example.

In the embodiment above, the third parity check matrix $H_3$ is adopted for the parity check matrix in the decoding operation. Namely, syndrome signals are generated according to the matrix $H_3$ and then the obtained syndrome is decoded to accomplish the error detection and correction. However, in place of the matrix $H_3$, there may be used for the decoding operation a parity check matrix $H_1''$ shown in FIG. 21. The matrix $H_1''$ is attained as follows. First, in the first parity check matrix $H_1$, columns are exchanged with each other in bytes and then the resultant matrix is shortened to obtain the matrix $H_1''$. The matrix $H_1''$ is also transformed from the matrix $H_3$ by elementary row operations. In this situation, the decoder circuit can also be configured in the same manner as for the embodiment above.

Incidentally, according to the present invention, the check bit generator may be constructed to receive information including a plurality of b-bit bytes so as to create check bytes from the received information according to a parity check matrix developed by conducting elementary row operations on the first parity check matrix $H_1$. Furthermore, the syndrome generator circuit may be structured such that on receiving encoded words including the information and the check bytes, the syndrome generating circuit generates syndrome from the words according to the first parity check matrix $H_1$.

In this case, the parity check matrix thus attained from the first parity check matrix $H_1$ may be produced as follows. First, elementary row operations are executed on the first parity check matrix $H_1$ to obtain a reduced echelon form, namely, the second parity matrix $H_2$. The matrix $H_2$ is then, if necessary, shortened to a third parity check matrix $H_3$, which is to be adopted as the objective matrix.

Furthermore, the circuit for generating the syndrome may be constituted to generate syndrome according to the parity check matrix transformed from the first parity check matrix $H_1$ by elementary row operations, column exchanges and/or shortening.

Figures 21, 22:
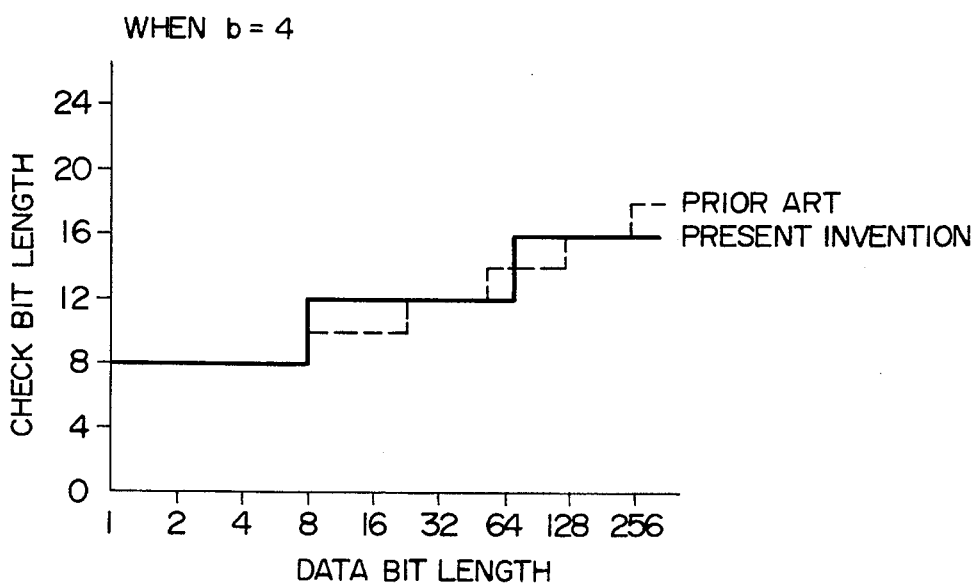
FIG. 21 is a diagram showing a parity check matrix used to decode signals in another embodiment according to the present invention.
FIG. 22 is a diagram showing the check bit length and the data bit length of SbEC-DED codes.

In accordance with the present invention, there can be provided an error detecting and correcting method achieving single byte error correction—double bit error detection with a reduced number of check bits as compared with the prior art. FIG. 22 shows in comparison the check bit lengths and the data bit lengths of SbEC-DED codes of the present invention and the conventional technology, respectively. The present invention is particularly superior to the prior art in a practical case where b=4 and data bit length=64. Actually, in a memory employing 4-bit memory elements, the number of memory elements necessary for the check bits is reduced to about 75% (three quarters) of that required in the prior art.

While particular embodiments of the invention have been shown and described, it will be obvious to those skilled in the art that various changes and modifications may be made without departing from the present invention in its broader aspects.

We claim:

1. An error detecting and correcting apparatus for maintaining a single b-bit byte error correction—double bit error detection (SbEC—DED) nature, comprising:

means for receiving the encoded word including a plurality of b-bit bytes where b is an integer not less than two and for generating a syndrome from the encoded word according to a first parity check matrix $H_1$; and means for correcting errors in the received encoded word based on the syndrome, wherein the first parity check matrix $H_1$ is $$H_1 = \begin{pmatrix} R(M,r) & \begin{vmatrix} 00\ldots0 \\ R(M,r-1) \end{vmatrix} & \begin{vmatrix} 00\ldots0 \\ 00\ldots0 \\ R(M,r-2) \end{vmatrix} & \ldots & \begin{vmatrix} 00\ldots0 \\ 00\ldots0 \\ \ldots \\ 00\ldots0 \\ R(M,2) \end{vmatrix} \end{pmatrix}$$

where r is an integer equal to or more than two, 0 stands for a b×b all zero R(M, r) is $$R(M, R) = \begin{bmatrix} I & I & I & \ldots & I \\ a(0) & a(1) & a(2) & \ldots & a(n-1) \end{bmatrix}$$

where, I indicates a b×b binary identity matrix; a(0), a(1), . . . , a(n−1) are respectively different elements of a (r−1)-order direct product of M on an assumption that M designates a residue class with respect to addition of a subfield $GF(2^d)$ of a Galois field $GF(2^b)$ comprised of power matrices of a companion matrix, d is a divisor of b, and n indicates a value obtained by raising 2 to the d·(r−1)-th power.

2. The apparatus according to claim 1, wherein the correcting means includes:

means for detecting errors in the received encoded word according to the syndrome;

means for generating signals indicating, based on the syndrome, positions of errors in the received encoded word; and means for correcting, based on the signals, the errors in the received encoded word.

3. The apparatus according to claim 2, further including:

means for receiving information comprising a plurality of b-bit bytes to be encoded and generating check bytes for the received information according to the first parity check matrix $H_1$, wherein the means receiving the encoded error for generating a syndrome receives the encoded word including the information and the check bytes and generates the syndrome from the received encoded word according to the first parity check matrix $H_1$.

4. The apparatus according to claim 2, further including:

means for receiving information comprising a plurality of b-bit bytes to be encoded and generating check bytes from the received information according to a parity check matrix obtained by elementary row operations from the first parity check matrix $H_1$, wherein the means for receiving the encoded word and for generating the syndrome receives the encoded word including the information and the check bytes and generates the syndrome from the received encoded word according to the first parity check matrix $H_1$.

5. The apparatus according to claim 4, wherein the parity check matrix thus obtained from the first parity check matrix $H_1$ is a third parity check matrix $H_3$ obtained by shortening a second parity check matrix $H_2$ configured in a reduced echelon form by achieving elementary row operations on the first parity check matrix $H_1$.

6. The apparatus according to claim 1, wherein the means for receiving the encoded word and for generating the syndrome generates the syndrome from the received encoded word according to the parity check matrix obtained from the first parity check matrix $H_1$ by at least one of elementary row operations, column exchanges and shortening.

7. The apparatus according to claim 1, wherein the encoded word has a data length of at least sixty four bits and a check bit length of twelve bits and wherein said b is four bits.

8. An error detecting and correcting apparatus, comprising:

means for receiving an encoded word including a plurality of b-bit bytes where b is an integer not less than two and means for decoding the received encoded word according to a first parity check matrix $H_1$, wherein said means for decoding includes means for correcting a single byte error of the received encoded word and detecting two bit errors thereof; and the first parity check matrix $H_1$ is $$H_1 = \begin{pmatrix} R(M,r) & \begin{vmatrix} 00\ldots0 \\ R(M,r-1) \end{vmatrix} & \begin{vmatrix} 00\ldots0 \\ 00\ldots0 \\ R(M,r-2) \end{vmatrix} & \ldots & \begin{vmatrix} 00\ldots0 \\ 00\ldots0 \\ \ldots \\ 00\ldots0 \\ R(M,2) \end{vmatrix} \end{pmatrix}$$

where r is an integer equal to or more than two, 0 stands for a b×b all zero matrix and R(M, r) is $$R(M, r) = \begin{bmatrix} I & I & I & \ldots & I \\ a(0) & a(1) & a(2) & \ldots & a(n-1) \end{bmatrix}$$

where I indicates a b×b binary identity matrix; a(0), a(1), . . . , a(n−1) are respectively different elements of a (r−1) order direct product of M on assumption that M designates a residue class with respect to addition of a subfield $GF(2^d)$ of a Galois field $GF(2^b)$ comprised of power matrices of a companion matrix, d is a divisor of b, and n indicates a value obtained by raising 2 to the d·(r−1)-th power.

9. The apparatus according to claim 8, wherein the encoded word has a data length of at least sixty four bits and a check bit length of twelve bits and wherein said b is four bits.

10. An error detecting and correcting method for correcting a single byte error and detecting two errors of an encoded word, comprising the steps of:

receiving the encoded word including a plurality of b-bit bytes where b is an integer not less than two and for generating, by a syndrome generating circuit, a syndrome from the encoded word according to a parity check matrix $H_1$; and correcting, by an error correction circuit, errors in the received encoded word based on the syndrome, wherein the first parity check matrix $H_1$ is $$H_1 = \left( \begin{array}{c|c|c|c|c} R(M,r) & \begin{matrix} 00\ldots 0 \\ R(M,r-1) \end{matrix} & \begin{matrix} 00\ldots 0 \\ 00\ldots 0 \\ R(M,r-2) \end{matrix} & \ldots & \begin{matrix} 00\ldots 0 \\ 00\ldots 0 \\ \ldots \\ 00\ldots 0 \\ R(M,2) \end{matrix} \end{array} \right)$$

where, r is an integer equal to or more than two, 0 stands for a b×b all zero matrix, and R(M, r) is $$R(M,r) = \left[ \begin{array}{c|c|c|c|c} I & I & I & \ldots & I \\ a(0) & a(1) & a(2) & \ldots & a(n-1) \end{array} \right]$$

where I indicates a b×b binary identity matrix; $a(0), a(1), \ldots, a(n-1)$ are respectively different elements of a (r−1)-order direct product of M on assumption that M designates a residue class with respect to addition of a subfield $GF(2^d)$ of a Galois field $GF(2^b)$ comprised of power matrices of a companion matrix, d is a divisor of b, and n indicates a value obtained by raising 2 to the d·(r−1)-th power.

11. The method according to claim 10, wherein the correcting step includes the steps of:

detecting errors in the received encoded word according to the syndrome;

generating signals indicating, based on the syndrome, positions of errors in the received encoded word; and correcting, based on the signals, the errors in the received encoded word.

12. The method according to claim 11, further including the steps of:

receiving information comprising a plurality of b-bit bytes to be encoded and generating check bytes from the received information according to the first parity check matrix $H_1$, wherein the syndrome generating step receives an encoded word including the information and the check bytes and generates the syndrome from the received encoded word according to the first parity check matrix $H_1$.

13. The method according to claim 11, further including the steps of:

receiving information comprising a plurality of b-bit bytes to be encoded and generating check bytes from the received information according to a parity check matrix obtained by elementary row operations from the first parity check matrix $H_1$, wherein the syndrome generating step receives the encoded word including the information and the check bytes and generates the syndrome from the received encoded word according to the first parity check matrix $H_1$.

14. The method according to claim 13, wherein the parity check matrix thus obtained from the first parity check matrix $H_1$ is a third parity check matrix $H_3$ obtained by shortening a second parity check matrix $H_2$ configured in a reduced echelon form by achieving elementary row operations on the first parity check matrix $H_1$.

15. The method according to claim 10, wherein the syndrome generating step generates the syndrome from the received encoded word according to the parity check matrix obtained from the first parity check matrix $H_2$ by at least one of elementary row operations, column exchanges and shortening.

16. The apparatus according to claim 10, wherein the encoded word has a data length of at least sixty four bits and a check bit length of twelve bits and wherein said b is four bits.

\* \* \* \* \*

UNITED STATES PATENT AND TRADEMARK OFFICE
CERTIFICATE OF CORRECTION

PATENT NO. : 5,563,894
DATED : October 8, 1996
INVENTOR(S) : Eiji Fujiwara, et al.

It is certified that error appears in the above-indentified patent and that said Letters Patent is hereby corrected as shown below:

Claim 1, column 11, line 23, after "zero" insert --matrix and--.

Signed and Sealed this

Twenty-eighth Day of January, 1997

Attest:

BRUCE LEHMAN

Attesting Officer    Commissioner of Patents and Trademarks